(12) United States Patent
Wu et al.

(10) Patent No.: US 7,198,975 B2
(45) Date of Patent: Apr. 3, 2007

(54) SEMICONDUCTOR METHODS AND STRUCTURES

(75) Inventors: Hua-Shu Wu, Hsinchu (TW); Tsung-Mu Lai, Hsin-Chu (TW); Ming-Chih Chang, Sinyuan Township, Pingtung County (TW); Che-Rong Laing, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 11/019,693

(22) Filed: Dec. 21, 2004

(65) Prior Publication Data

US 2006/0131697 A1  Jun. 22, 2006

(51) Int. Cl.
*H01L 21/00* (2006.01)

(52) U.S. Cl. .......................................... 438/52; 438/53

(58) Field of Classification Search .................. 438/48, 438/50, 53, 52, 57
See application file for complete search history.

(56) References Cited

U.S. PATENT DOCUMENTS

| | | | | |
|---|---|---|---|---|
| 5,043,043 A | * | 8/1991 | Howe et al. ................... 216/17 |
| 5,252,881 A | * | 10/1993 | Muller et al. ................ 310/309 |
| 5,459,602 A | * | 10/1995 | Sampsell ..................... 359/234 |
| 5,510,299 A | * | 4/1996 | Li et al. ........................ 438/57 |
| 5,600,190 A | * | 2/1997 | Zettler .................. 310/40 MM |
| 5,660,680 A | | 8/1997 | Keller |
| 5,668,062 A | | 9/1997 | Hyun et al. |
| 6,150,186 A | | 11/2000 | Chen et al. |
| 6,337,027 B1 | | 1/2002 | Humphrey |

* cited by examiner

*Primary Examiner*—Brook Kebede
(74) *Attorney, Agent, or Firm*—Duane Morris LLP (57) ABSTRACT

A method and a structure are provided for preventing lift-off of a semiconductor monitor pattern from a substrate. A semiconductor structure and a semiconductor monitor structure are formed on a substrate. A material layer is formed covering the semiconductor monitor structure. A part of the semiconductor structure is removed without removing the semiconductor monitor structure, by using the material layer as an etch protection layer. A mask for the method is also provided. The mask includes a clear area and a dark area. The dark area prevents a semiconductor monitor structure from being subjected to exposure so as to form a material layer covering the semiconductor monitor structure and prevent removal of the semiconductor monitor structure from the substrate while a part of a semiconductor structure is removed.

13 Claims, 7 Drawing Sheets

SEMICONDUCTOR METHODS AND STRUCTURES

BACKGROUND OF THE INVENTION

1. Field of the Invention

The present invention relates to the fabrication of integrated circuit devices on semiconductor substrates and, more particularly relates to methods for fabricating monitor structures on the substrates.

2. Description of the Related Art

The manufacture of large scale integrated circuits in a mass production facility involves hundreds of discrete processing steps beginning with the introduction of blank semiconductor wafers at one end and recovering the completed chips at the other. The manufacturing process is usually viewed as consisting of the segment wherein the semiconductor devices are formed within the silicon surface (front-end-of-line) and the portion which includes the formation of the various layers of interconnection metallurgy above the silicon surface (back-end-of-line). Most of these processing steps involve depositing layers of material, patterning them by photolithographic techniques, and etching away the unwanted portions. The materials consist primarily of insulators and metal alloys. In some instances the patterned layers serve as temporary protective masks. In others they are the functional components of the integrated circuit chip.

While most development has been directed towards the manufacture of semiconductor based electronic circuits, there has recently been considerable interest in integrating electromechanical devices such as electric motors, springs cantilevered devices, and mechanical switches and oscillators within these electronic circuits. The repertoire of material along with a variety of available deposition and selective etching methods which have been developed in the integrated circuit industry along with a refined patterning technology have made possible the manufacture of tiny mechanical devices with movable elements. A movable element, for example the rotor of an electric motor, is patterned of material deposited onto a sacrificial layer, within a stator element. The sacrificial layer is then removed by selective isotropic etching which undercuts the rotor, freeing it from the substrate. Cantilevered devices such as mechanical switches, tuning forks or other oscillators, and leaf springs are similarly formed partially over a sacrificial layer, with an anchored portion connected to a subjacent structure.

In order to monitor the integrated circuit manufacturing process, test structures, representative of the circuit elements are typically incorporated in regions of the wafer outside the integrated circuit chips. Examples of these inline test devices include a dumb-bell structure testable with a four point probe to establish proper resistance of a deposited layer, or long serpentine metal lines which can be tested to establish the presence of particulate defects by testing for electrical opens and shorts. These devices are often designed much larger than their corresponding elements in the integrated circuit so they can be tested at various stages during processing.

Typically, these test devices are formed in the saw kerf which separates the circuit chips. In some instances, the test devices are formed in a designated chip site, referred to as a test site. However, this is usually avoided because it utilizes valuable product chip real estate.

In a product, which has micro electromechanical systems (MEMS), it is also desirable to have representative test structures to perform timely in-line testing of these devices as well. A problem with forming electromechanical test structures in the wafer kerf, or even in test sites, is that considerable particulate debris can be generated by the fracturing of free standing or lightly attached elements of these test structures. The expression "lightly attached" is used herein to indicate a structural element, for example, a long cantilever with a relatively small region of attachment to the substrate, thereby rendering it easily broken off. It is therefore desirable to have test structures for electromechanical devices which are designed to provide useful in-line testing but not having free standing or even lightly attached elements like their circuit counterparts.

Figure 1:
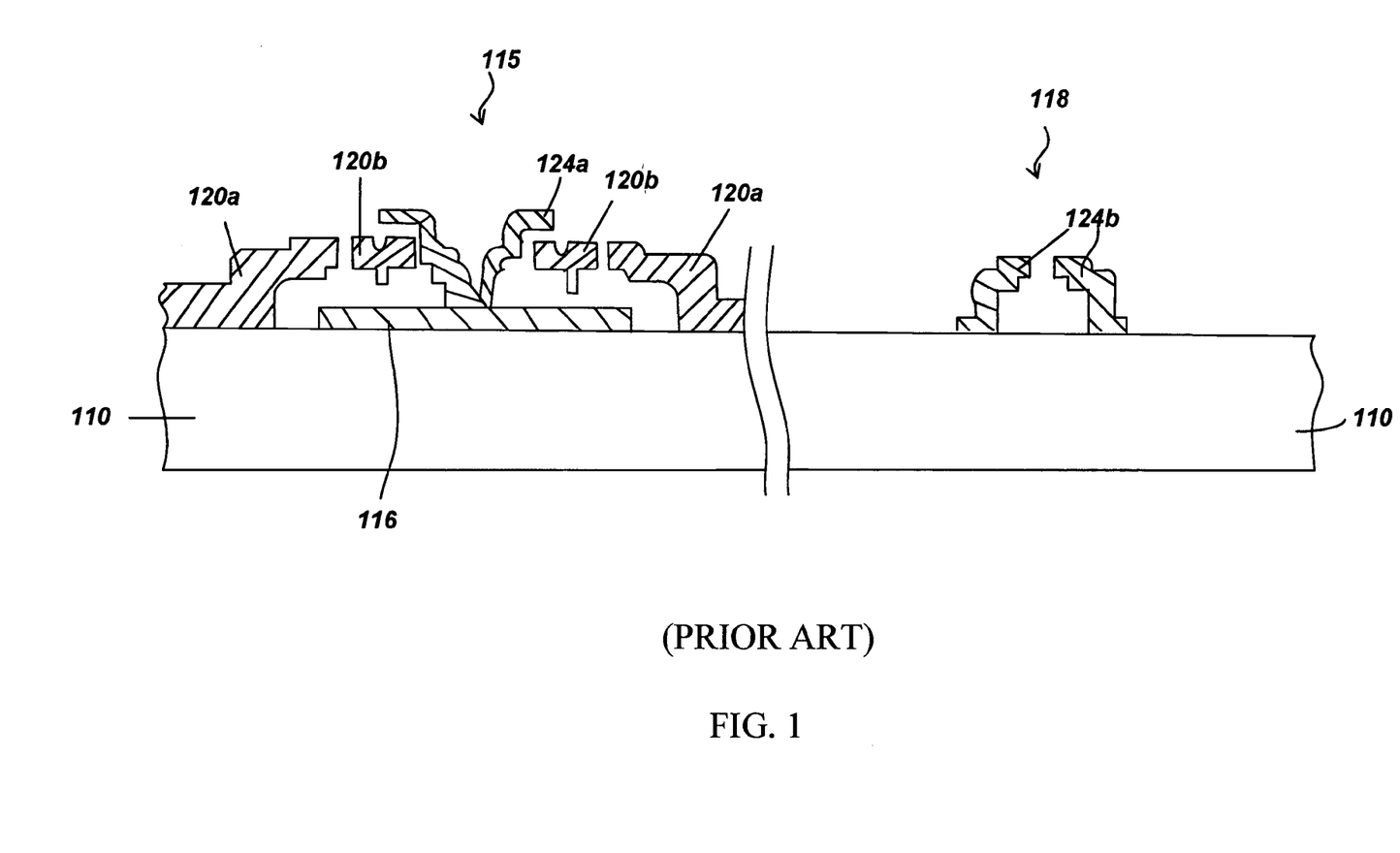
FIG. 1 is a schematic cross sectional view showing a prior art MEMS device.

FIG. 1 is a schematic cross sectional view showing a prior art MEMS device. The MEMS device comprises a central bearing 124a, a rotor 120b and a stator 120a in the semiconductor structure area 115 of the substrate 110. It also comprises a monitor pattern 124b in the semiconductor monitor structure area 118. The polysilicon plate 16 serves as an electric shield. Before forming the pattern in FIG. 1, a relieving process is used to remove sacrificial layers (not shown) in the semiconductor structure and the semiconductor monitor structure. The relieving process usually is a wet etch process and may lift off the semiconductor monitor structure 124b if the semiconductor monitor structure 124b is not well anchored to the substrate 110. The lift-off of the semiconductor monitor structure 124b results in a particle issue that reduces the yield of the MEMS devices. In order to resolve the particle issue, the semiconductor monitor structure 124b should be well anchored to the substrate 110 by increasing the contact area between the semiconductor monitor structure 124b and the substrate 110. But when the semiconductor monitor structure 124b becomes complicated, the design of maintaining the contact area between the monitor structure 124b and the substrate 110 also becomes complicated. Such a design has increased inconvenience for fabricating the MEMS devices.

Further, process monitors in the saw kerf of the wafer, with non-anchored or lightly attached mechanical elements, would release significant (or more than normal) debris during wafer dicing. U.S. Pat. No. 5,668,062 shows that when integrated circuit chips contain mechanical devices, in this instance mechanical mirrors, that the chips cannot be protectively coated during wafer dicing. Steps must be taken to eliminate metal fragments in the saw debris and which would otherwise lodge under the movable mirrors. The solution taught by the reference involves defining scribe line extensions of the array scribe lines to the edge of the wafer, whereby the scribe line extensions as well as the array scribe lines are free of the metal which is used to form the mirrors. While the procedure is very narrow in scope, the reference nevertheless shows that a specific type of debris (aluminum flakes during the dicing operation) compromises the proper function of MEMS devices.

U.S. Pat. No. 6,337,027 B1 teaches the formation of MEMS devices which are formed from in an epitaxial layer on a sacrificial silicon substrate. The devices, still on the substrate, are then bonded onto pedestals on a glass substrate. The sacrificial silicon substrate is then removed by spray etching, leaving the individual devices mounted on the supporting pedestals. The reference includes several methods of encapsulation of the complete MEMS devices before the substrate is diced using laser scribing.

U.S. Pat. No. 6,150,186 teaches the coating of a metal wire spring bonded to a silicon substrate to form a more resilient spring. The coating method improves the mechanical properties of the spring. The coating method may also be used to improve the resiliency of other spring devices such as a cantilevered spring.

U.S. Pat. No. 5,660,680 cites procedures for forming various useful micro structures such as tubes and beams as well as micro sensing and actuating devices by the use of patterned sacrificial molds in which the devices are formed and thereafter released by etching away the mold.

SUMMARY OF THE INVENTION

A method for preventing removal of a semiconductor monitor pattern from a substrate includes forming a semiconductor structure and a semiconductor monitor structure on a substrate. A material layer is formed covering the semiconductor monitor structure. A part of the semiconductor structure is removed without removing the semiconductor monitor structure by using the material layer as an etch protection layer.

A structure comprises semiconductor monitor structure having a first sacrificial layer and a structural layer contacting to each other. A material layer covers the first sacrificial layer and the structural layer so as to prevent removal of the first sacrificial layer from a substrate while a second sacrificial layer of a semiconductor structure is removed from the same substrate.

The above and other features of the present invention will be better understood from the following detailed description of the preferred embodiments of the invention that is provided in connection with the accompanying drawings.

DESCRIPTION OF THE PREFERRED EMBODIMENT

FIGS. 2A–2F are cross sectional views showing a process of forming a micro electormechanical system (MEMS) device.

Figure 2A:
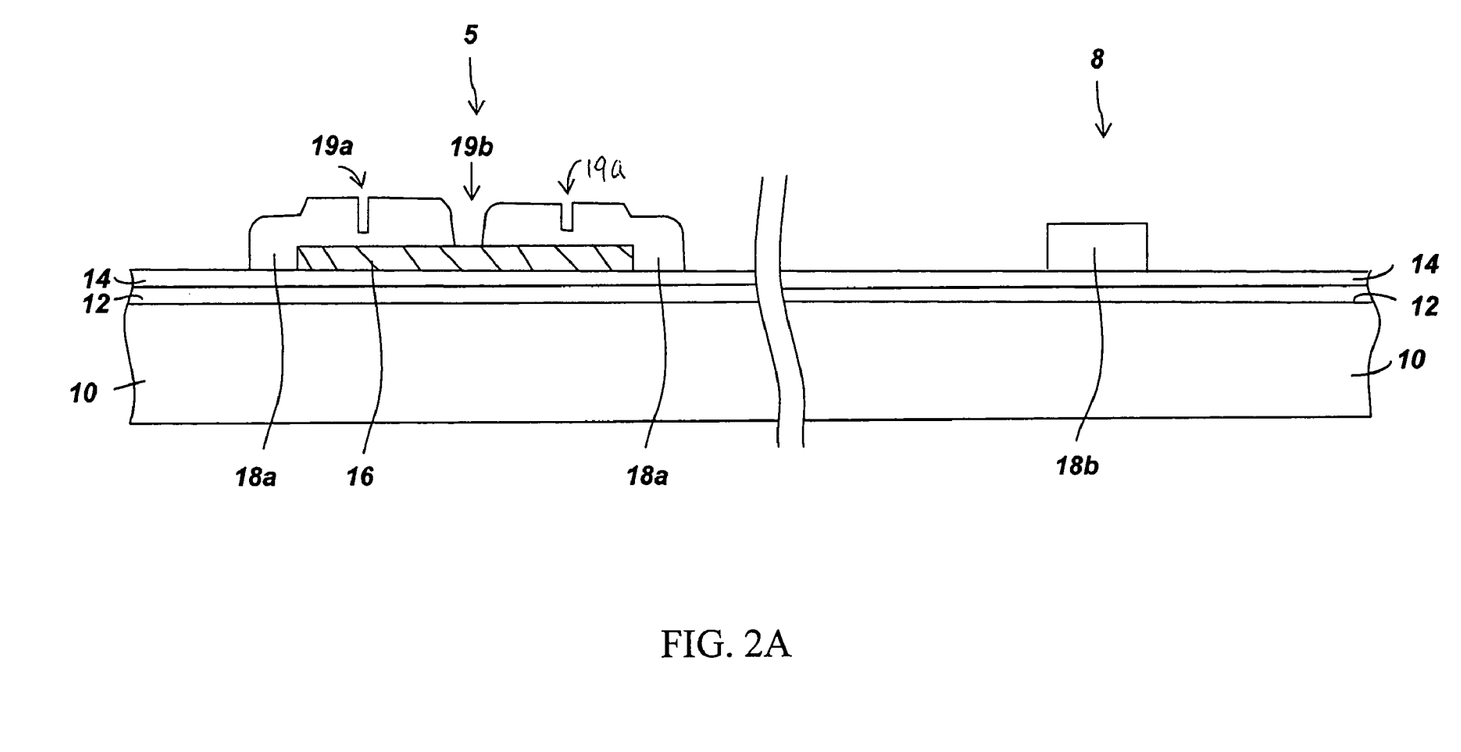
FIGS. 2A–2F are cross sectional views showing a process of forming a micro electormechanical system (MEMS) device.

Referring to FIG. 2A, a substrate 10 comprises a semiconductor structure area 5 and a semiconductor monitor structure area 8. The semiconductor structure area 5 is adapted to have a semiconductor structure, such as a transistor (not shown), formed thereon, and the semiconductor monitor structure area 8 is adapted to have a semiconductor monitor structure (shown in FIG. 2E) formed thereon.

A pad layer 12 is formed on the substrate 10. A base layer 14 is formed on the pad layer 12. A polysilicon plate 16 is formed on the base layer 14. A first sacrificial layer, including portions 18a and 18b, is formed on the base layer 14. Portion 18a of the first sacrificial layer covers a part of the polysilicon plate 16. Portion 18b of the first sacrificial layer is also formed on the base layer 14 in the semiconductor monitor structure area 8.

The substrate 10 may also comprise shallow trench isolation (STI) structures (not shown) and gate structures (not shown) formed thereon. The pad layer 12 can be a material such as silicon oxide, silicon nitride or silicon oxy-nitride and be formed by Chemical Vapor Deposition (CVD) or thermal oxidation. In some embodiments, the pad layer 12 is a pad oxide with a thickness from about 10 nm to about 100 nm. The base layer 14 can be a material such as silicon nitride or silicon oxy-nitride and can be formed, for example, by CVD. In this embodiment, the semiconductor structure to be formed in the semiconductor structure area 5 comprises a micro electric motor having a fixed stator 20a (FIG. 2E) and a free floating rotor 20b (FIG. 2E). The rotor 20b is a circular free floating element which operates within a circular opening in the stator 20a. The polysilicon plate 16 can be formed, for example, by CVD. The pattern of the polysilicon plate 16 can be formed by forming a polysilicon layer (not shown) on the base layer 14 and patterning the polysilicon layer by a photolithographic process and an etch process. The polysilicon plate 16 serves as an electric shield as well as a hard bearing surface upon which the to-be-formed rotor will operate.

A first sacrificial material (not shown) is then formed over the substrate 10, covering the base layer 14 and the polysilicon layer 16. The first sacrificial material can be material such as silicon oxide, silicon nitride, silicon oxy-nitride or another material which has an etch removal rate with respect to an etch process different from that of the polysilicon layer 16 and the base layer 14. After reading the descriptions of this embodiment, one of ordinary skill in the art will understand how to select the materials of the base layer 14 and the first sacrificial material. The first sacrificial material is substantially conformal over the structure comprising the base layer 14 and the polysilicon layer 16. In some embodiments, the first sacrificial material is silicon oxide. A photolithographic process and an etch process then pattern the first sacrificial material so as to form the first sacrificial layer portions 18a and 18b in the semiconductor structure area 5 and the semiconductor monitor structure area 8, respectively. Openings 19a and 19b are also formed in the first sacrificial layer portion 18a. The openings 19a are etched in the first sacrificial layer portions 18a to fashion bushings 20bb on the rotor (20b in FIG. 2B) which will ride on the polysilicon plate 16. The openings 19a are etched nearly, but not all the way, through to the polysilicon plate 16 so that when the first sacrificial layer 18a is etched out, the rotor bushing 20bb will be free floating. The center opening 19b is etched through to the polysilicon plate 16 to form the bottom section of a mold in which a fixed central bearing 24a (FIG. 2D) of the rotor 20b will be formed. The central bearing 24a (shown in FIG. 2E) will be anchored to the polysilicon plate 16 at the base layer 14 of the opening 19b and will become the axis of rotation of the rotor 20b. The central bearing 24a will also retain the rotor 20b within its region of operation. In the semiconductor monitor structure area 8, the first sacrificial layer portion 18b becomes an element of the semiconductor monitor structure.

In some embodiments, the first sacrificial layer portions 18a and 18b are formed by different processes which form and pattern different structural materials so as to form the first sacrificial layer portions 18a and 18b. One of ordinary skill in the art will understand that forming the first sacrificial layer portions 18a and 18b of the same material in the same process can simplify the manufacturing of the MEMS device.

Figure 2B:
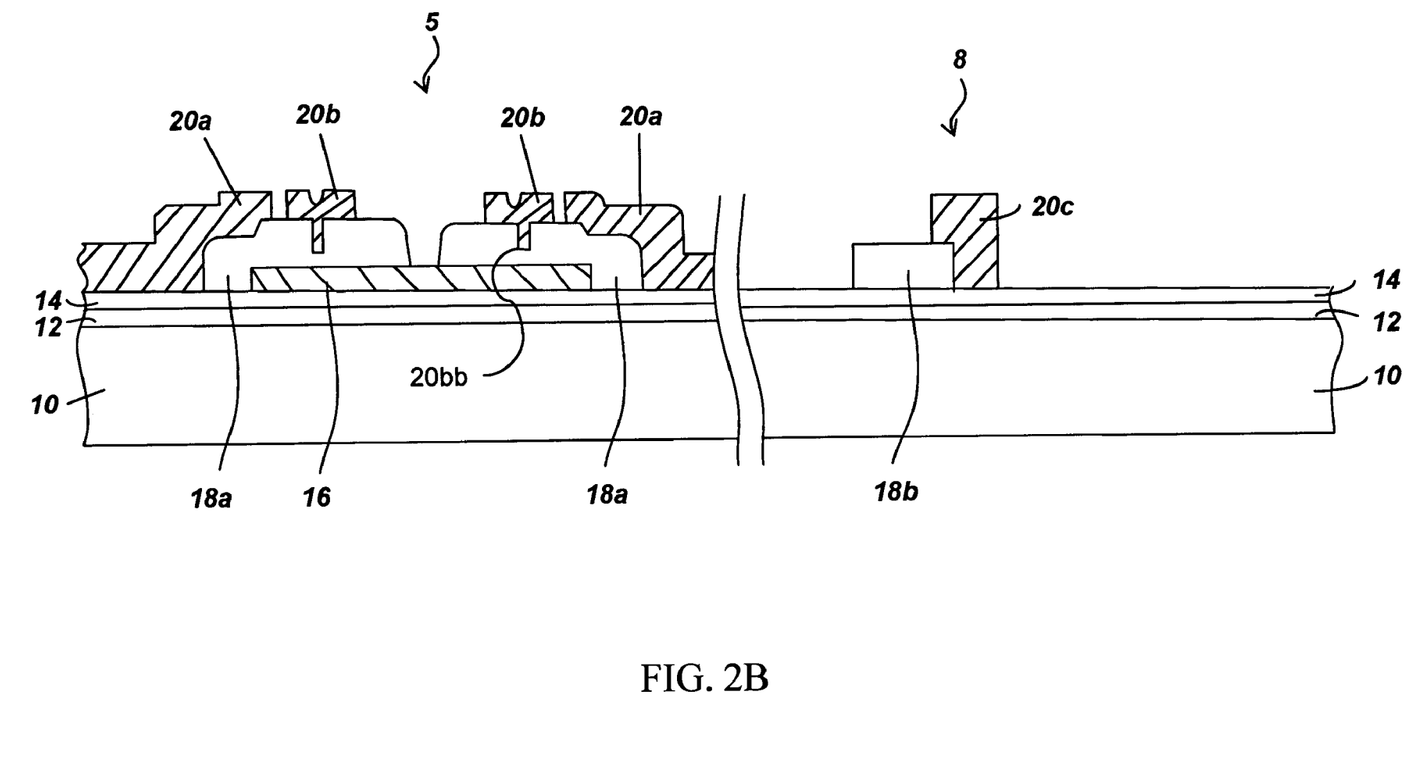

Referring to FIG. 2B, first structural layer portions 20a and 20b, and 20c are formed in the semiconductor structure area 5 and the semiconductor monitor structure area 8, respectively. The term "structural layers" refers to layers that are not sacrificial layers. The first structural layer portions 20a and 20b can be a material such as silicon and can be formed, for example, by CVD. In some embodiments, the first structural layer portions 20a and 20b are doped polysilicon. The pattern of the first structural layer portions 20a and 20b can be formed, for example, by forming a first structural material (not shown) over the structure in FIG. 2A. A photolithographic process and an etch process pattern the first structural material so as to form the first structural layer portions 20a and 20b. The portions 20a and 20b of the first structural layer in the semiconductor structure area 5 serves as a stator and a rotor, respectively. The portion 20c of the first structural layer in the semiconductor monitor structure area 8 becomes another element of the semiconductor monitor structure. The portion 20c of the first structural layer is patterned in such a fashion, to be a monitor structure representative of the rotor 20b and stator 20a in the semiconductor structure area 5, which contacts the portion 18b of the first sacrificial layer. In some embodiments, the first structural layer portions 20a and 20b are formed by different processes which form and pattern different structural materials so as to form the first structural layer portions 20a and 20b. One of ordinary skill in the art will understand that forming the portions 20a and 20b of the first structural layers in the same process can simplify the manufacturing of the MEMS device.

Figure 2C:
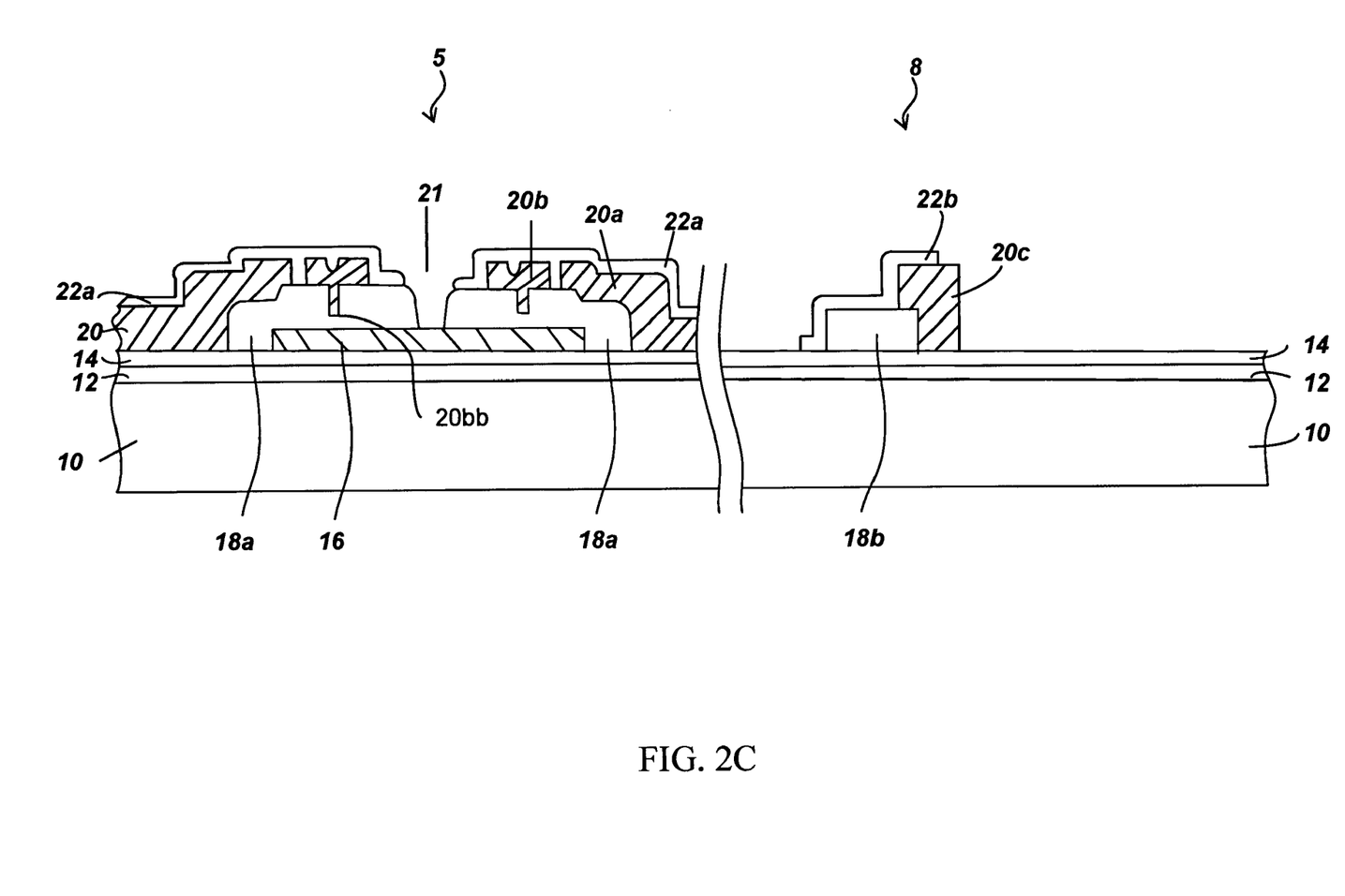

Referring to FIG. 2C, portions 22a and 22b of a second sacrificial layer are formed in the semiconductor structure area 5 and the semiconductor monitor structure area 8, respectively. The second sacrificial layer portions 22a and 22b cover the first structural layer portions 20a and 20b, exposing the polysilicon plate 16 in the opening 21. The second sacrificial layer portion 22b partially covers the first sacrificial layer portion 18b and the first structural layer portion 20c. The portion 22b of the second structural layer in the semiconductor monitor structure area 8 becomes another element of the semiconductor monitor structure. The second sacrificial layer portions 22a and 22b can be a material such as silicon oxide, silicon nitride, silicon oxynitride or the other material which has a removal rate with respect to an etch process different from that of the first structural layer portions 20a, 20b and 20c. In some embodiments, the second sacrificial layer portions 22a and 22b are oxide and can be formed, for example, by CVD. The pattern of the second sacrificial layer portions 22a and 22b can be formed, for example, by forming a second sacrificial material over the structure in FIG. 2B. A photolithographic process and an etch process then pattern the second sacrificial material so as to form the second sacrificial layer portions 22a and 22b. In some embodiments, the first sacrificial layer portions 18a and 18b have a material similar to that of the second sacrificial layer portions 22a and 22b. With similar material properties, the first sacrificial layer portion 18a and the second sacrificial layer portion 22a can be removed in one etch process. One of ordinary skill in the art, after viewing the descriptions of this embodiment, will understand that the selection of the material for the first sacrificial layer 18a and the second sacrificial layer 22a takes into consideration the process for fabricating the semiconductor structure.

In some embodiments, the second sacrificial layer portions 22a and 22b are formed by different processes which form and pattern different structural materials. One of ordinary skill in the art will understand that forming the second sacrificial layer portions 22a and 22b in the same process can simplify the manufacturing of the MEMS device.

Figure 2D:
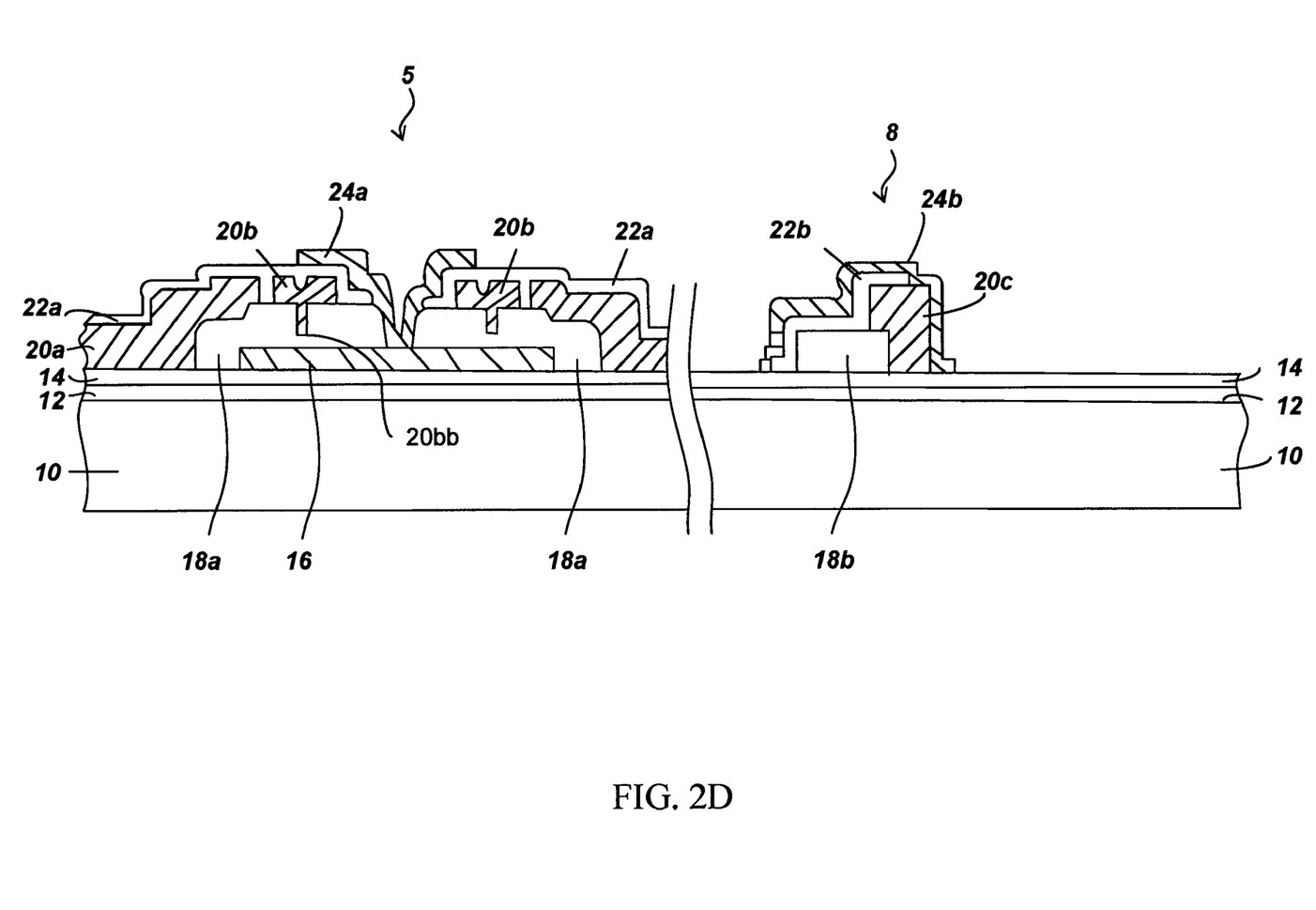
Figure 2E:
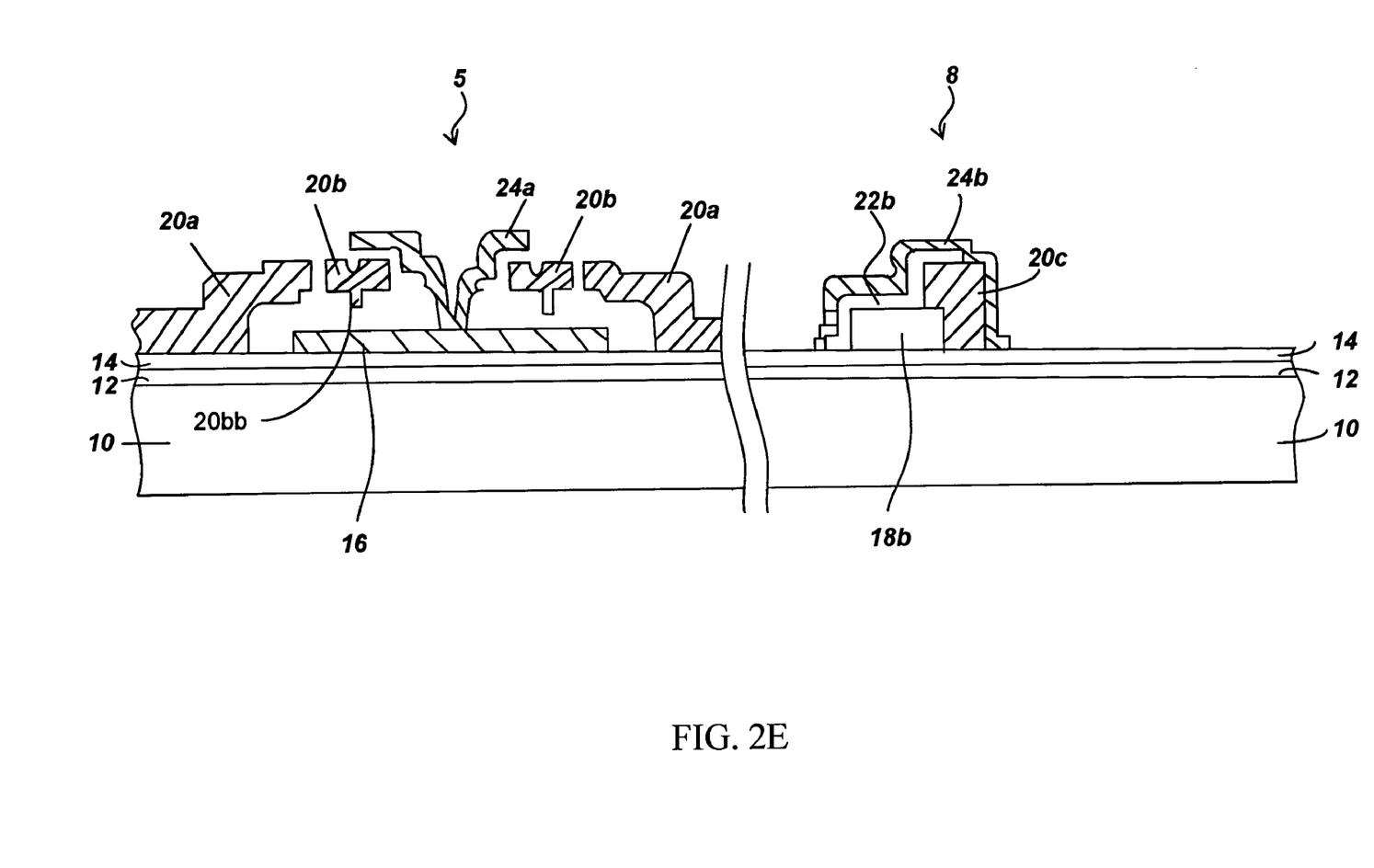

Referring to FIG. 2D, second structural layer portions 24a and 24b are formed in semiconductor structure area 5 and the semiconductor monitor structure area 8. The second structural layer 24a is formed in the opening 21, serving as a central bearing. The second structural layer 24b covers the first sacrificial layer 18b, the first structural layer 20c and the second sacrificial layer 22b. The second structural layer portions 24a and 24b can be a material such as silicon and can be formed, for example, by CVD. In this embodiment, the second structural layer portions 24a and 24b are doped polysilicon. The pattern of the second structural layer portions 24a and 24b can be formed, for example, by forming a second structural material (not shown) over the structure in FIG. 2C. A photolithographic process and an etch process pattern the second structural material so as to form the second structural layer portions 24a and 24b. In this embodiment, the second structural layer 24b covers the first sacrificial layer 18b, the first structural layer 20c and the second sacrificial layer 22b. In some embodiments, structure 24b may be part of an additional sacrificial layer covering the first sacrificial layer 18b, the first structural layer 20c and the second sacrificial layer 22b, as long as the structure 24b is not removed in the subsequent relieving process that removes sacrificial layer portions 18a and 22a.

Referring to FIG. 2E, a relieving process removes the first sacrificial layer 18a and the second sacrificial layer 22a. The relieving process may comprise, for example, a dry etch process or a wet etch process. In this embodiment, both of the first sacrificial layer 18a and the second sacrificial layer 22a are oxide. The relieving process may comprise a wet etch process with a solution such as diluted HF, buffered HF or the other solution that is adapted to remove oxide. In this embodiment, the wet etch process has a higher etch rate for the sacrificial layer than the etch rate for the structural layer.

In some embodiments, the material of the first sacrificial layer 18a is different from that of the second sacrificial layer 22a. Then a two-step etch process may be required. The first etch step removes the first sacrificial layer 18a and the second etch step removes the second sacrificial layer 22a. However, if the materials of the first sacrificial layer 18a and the second sacrificial layer 22a are such that one-step etch process can remove the first sacrificial layer 18a and the second sacrificial layer 22a without difficulty, the two-step etch process is not necessarily required. After reading the descriptions of this embodiment, one of ordinary skill in the art will understand how to select the etch process and how to arrange the etch steps for the sacrificial layer portions.

In the semiconductor structure area 5, the rotor, i.e. the first structural layer 20b, is free floating, and retained within its operational cavity by the second structural layer 25a which securely anchors to the polysilicon plate 16. In the semiconductor monitor structure area 8, the semiconductor monitor structure comprises the first sacrificial layer 18b, the first structural layer 20c and the second sacrificial layer 22b. Due to the covering of the second structural layer 24b, the relieving process does not remove the sacrificial layer portions 18b and 22b or structural layer portions 20c and 24b. The concern regarding the lift-off of the sacrificial layer portions 18b and 22b or structural layer portions 20c and 24b which results in particles on the wafer can be eliminated.

Referring to FIG. 2E, the first sacrificial layer 18b, the first structural layer 20c and the second sacrificial layer 22b anchor to the base layer 14. In some embodiments, it is not necessarily required that the first sacrificial layer 18b, the first structural layer 20c and the second sacrificial layer 22b anchor to the base layer 14, because the second structural layer 24b covers the semiconductor monitor structure. Accordingly, the design of the semiconductor monitor structure can be more flexible without a risk that the unanchored layers will lift off causing the particle issue.

In this embodiment, the structural layer 24b is used to cover the semiconductor monitor structure. In some embodiments, an additional sacrificial layer (not shown) can be used to prevent the semiconductor monitor structure 18b, 20c, 22b from being relieved as long as the additional sacrificial layer is not substantially removed while the relieving process removes the sacrificial layer portions 18a and 22a.

Figure 2F:
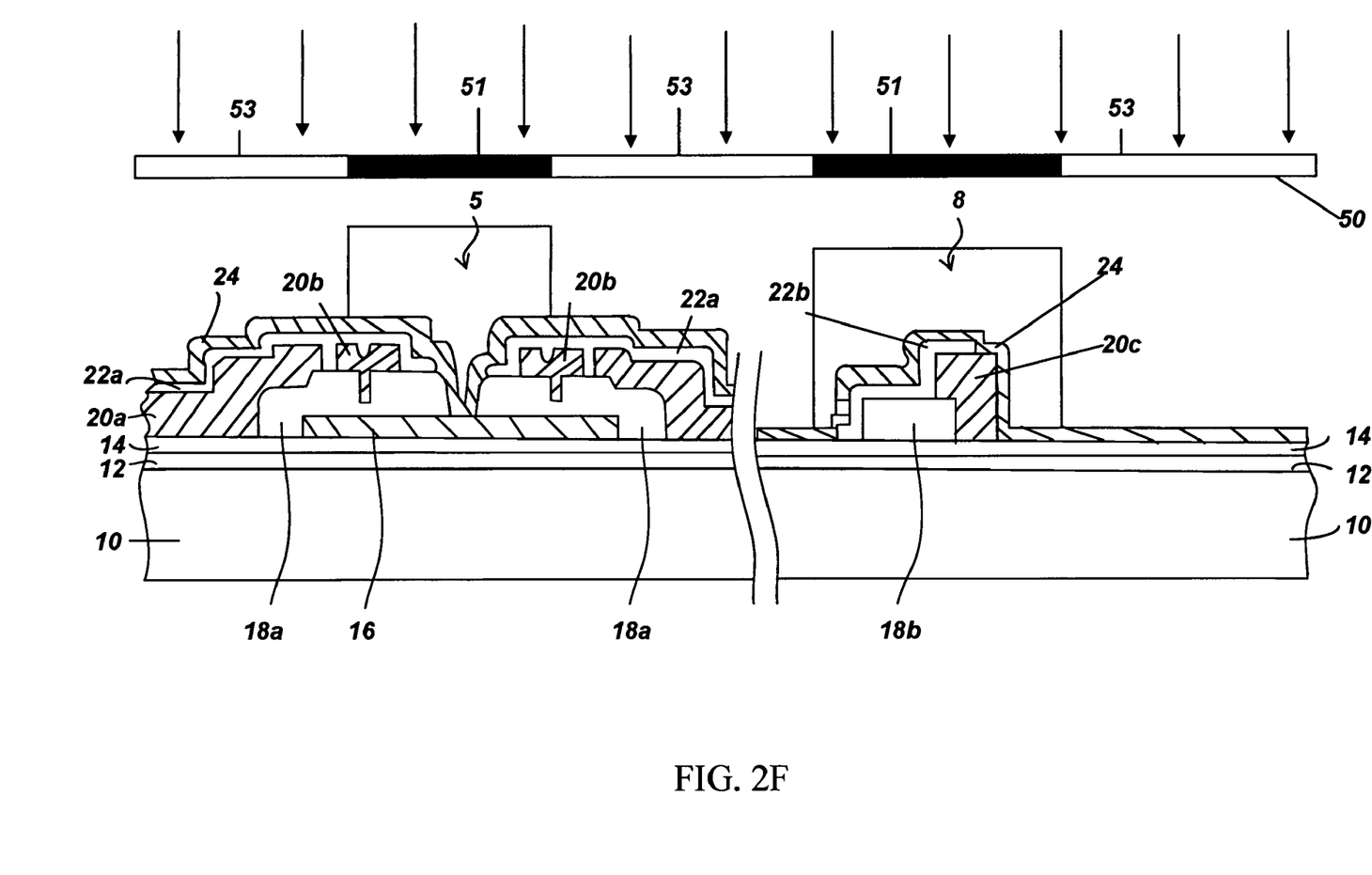

FIG. 2F is a schematic drawing showing an exemplary photolithographic process by for forming the structure shown in FIG. 2D by using a mask. According to the descriptions above, a mask 50 for a photolithographic process is required to prevent a photoresist layer 60 which covers the semiconductor monitor structure on the semiconductor monitor structure area 8 from being exposed. The mask 50 comprises clear areas 53 and dark areas 51. The clear areas 53 subject a photoresist material (not shown) to the exposure process and the photoresist material under the clear areas 53 is removed. The dark areas 51 prevent the photoresist material from being exposed so as to form the photoresist layers 60 which cover the semiconductor monitor structure and the area where a central bearing 24a is going to be formed. Then the photoresist layers 60 serves as an etch mask for removing portions of the second structural layer 24. After the removing process, the photoresist layers 60 are removed and a structure shown in FIG. 2D is thus formed. Accordingly, the second structural layer portion 24b shown in FIG. 2D covers the semiconductor monitor structure so as to prevent the lift-off of the semiconductor monitor structure from the substrate 10 while the sacrificial layer portions 18a and 22a of the semiconductor structure are removed. The mask 50 can be, for example, a mask for forming a sacrificial layer pattern or a structural layer pattern. One of ordinary skill in the art, after reading the descriptions of this embodiment, will understand how to design the mask on the sacrificial layer mask or the structural layer mask.

Although the present invention has been described in terms of exemplary embodiment, it is not limited thereto. Rather, the appended claims should be constructed broadly to include other variants and embodiments of the invention which may be made by those skilled in the field of this art without departing from the scope and range of equivalents of the invention.

What is claimed is:

1. A method for preventing removal of a semiconductor monitor pattern from a substrate, comprising:
   (a) forming a first structure and a monitor structure on a substrate, wherein the first structure is separated from the monitor structure;
   (b) forming a material layer covering the monitor structure; and
   (c) removing a part of the first structure to form a micro electromechanical system without removing the monitor structure by using the material layer as an etch protection layer.

2. The method of claim 1, where the first structure comprises a sacrificial layer and a structural layer.

3. The method of claim 2, wherein the step of removing the part of the first structure removes the sacrificial layer.

4. The method of claim 3, wherein the step of removing the part of the first structure comprises using a wet etch process.

5. The method of claim 4, wherein the wet etch process has an etch rate for the sacrificial layer higher than an etch rate for the structural layer.

6. The method of claim 1, wherein the monitor structure comprises a sacrificial layer and a structural layer.

7. The method of claim 6, wherein the first structure comprises the sacrificial layer and the structural layer.

8. The method of claim 6, wherein the structural layer of the monitor structure does not anchor to the substrate.

9. The method of claim 1, wherein the step of forming a material layer comprises forming a sacrificial layer or a structural layer.

10. The method of claim 1, wherein step (b) is performed using a mask for photolithography, which comprises a clear area and a dark area, the dark area preventing the monitor structure from being exposed so as to form the material layer covering the monitor structure and prevent removal of the monitor structure from the substrate while the part of a first structure is removed.

11. The method of claim 10, wherein the dark area is disposed in a scribe line area or in a test key area of the mask.

12. The method of claim 10, wherein the mask is used during an exposure performed after a material layer covers the first structure and the monitor structure.

13. The method of claim 1, wherein a part of the first structure remaining after step (c) is a micro electromechanical system device.

* * * * *